United States Patent [19]
Iino

[11] Patent Number: 6,075,373
[45] Date of Patent: Jun. 13, 2000

[54] INSPECTION DEVICE FOR INSPECTING A SEMICONDUCTOR WAFER

[75] Inventor: Shinji Iino, Yamanashi-ken, Japan

[73] Assignee: Tokyo Electron Limited, Japan

[21] Appl. No.: 08/862,601

[22] Filed: May 23, 1997

[30] Foreign Application Priority Data

May 31, 1996 [JP] Japan ................................ 8-160828

[51] Int. Cl.[7] ............................. G01R 31/02; G01R 1/04
[52] U.S. Cl. ........................................ 324/754; 324/758
[58] Field of Search ................................. 324/765, 754, 324/72.5, 758, 158.1, 73.1, 760

[56] References Cited

U.S. PATENT DOCUMENTS

| | | |
|---|---|---|
| 4,103,232 | 7/1978 | Sugita et al. . |
| 4,485,911 | 12/1984 | Cameron . |
| 4,786,867 | 11/1988 | Yamatsu . |
| 4,787,800 | 11/1988 | Sone et al. . |
| 4,938,654 | 7/1990 | Schram . |
| 5,105,147 | 4/1992 | Karasikov et al. . |
| 5,148,100 | 9/1992 | Sekiba . |
| 5,172,053 | 12/1992 | Itoyama . |
| 5,206,627 | 4/1993 | Kato et al. . |
| 5,315,237 | 5/1994 | Iwakura et al. ........................ 324/754 |
| 5,319,216 | 6/1994 | Mokuo et al. . |
| 5,331,407 | 7/1994 | Doi et al. . |
| 5,374,147 | 12/1994 | Hiroki et al. . |
| 5,374,888 | 12/1994 | Karasawa . |
| 5,409,348 | 4/1995 | Suzuki . |
| 5,410,259 | 4/1995 | Fujihara et al. ........................ 324/758 |
| 5,420,520 | 5/1995 | Anschel et al. . |
| 5,479,108 | 12/1995 | Cheng . |
| 5,539,676 | 7/1996 | Yamaguchi ........................... 324/758 |
| 5,694,050 | 12/1997 | Noguchi .............................. 324/765 |

FOREIGN PATENT DOCUMENTS

| | | |
|---|---|---|
| 0313466 | 5/1996 | European Pat. Off. . |
| 64-73392 | 3/1989 | Japan . |
| 1-103849 | 4/1989 | Japan . |
| 2-51244 | 2/1990 | Japan . |
| 2-66474 | 3/1990 | Japan . |
| 5-67652 | 3/1993 | Japan . |
| 5-110214 | 4/1993 | Japan . |
| 5-99788 | 4/1993 | Japan . |
| 06268035 | 9/1994 | Japan . |
| 6-268035 | 9/1994 | Japan . |
| 07235572 | 9/1995 | Japan . |
| 7-85196 | 9/1995 | Japan . |
| 07321167 | 12/1995 | Japan . |
| 08037213 | 2/1996 | Japan . |

Primary Examiner—Josie Ballato
Assistant Examiner—Minh Tang
Attorney, Agent, or Firm—Graham & James LLP

[57] ABSTRACT

The invention provides a simple, light-weight inspection device by arranging a mechanical path switching mechanism. The invention includes a device main body, one or more inspection targets having a plurality of connection pads, a test portion for measuring the electrical characteristics of the inspection targets on the basis of electrical signals from the inspection targets, a mounting device for mounting the inspection targets at predetermined positions with respect to the device main body, a probe card having a plurality of probe pads on its upper surface, which are electrically connected to the connection pads of the inspection targets mounted on the mounting device through an electrical contact device, a contact block having contact pins which removably contact the respective probe pads of the probe card, a connection device for electrically connecting the contact pins of the contact block and the test portion, and a contact block support/moving device for movably supporting the contact block in the circumferential direction at the peripheral of the probe card. In the invention, the plurality of probe pads are divided into a plurality of groups, which are circumferentially arranged at peripheral portions of the upper surface of the probe card.

12 Claims, 4 Drawing Sheets

INSPECTION DEVICE FOR INSPECTING A SEMICONDUCTOR WAFER

BACKGROUND OF THE INVENTION

The present invention relates to an inspection device for inspecting the electrical characteristics of an IC chip formed on a semiconductor wafer or an electronic component such as an LCD board.

In recent years, with the development of IC manufacturing techniques, the density, integration, and operation speed of semiconductor integrated circuits are increasing. The electrical characteristics of a large number of IC chips formed on a semiconductor wafer are measured before packaging to inspect whether they are normal. To inspect each chip on the semiconductor wafer, for example, a probe device is used. The probe device comprises a POGO pin (name of a contact probe, or a spring contact pin used in trade) ring and a probe card. The POGO pin ring has POGO pins for transmitting, to the probe card, an RF inspection signal sent from a test section for measuring the electrical characteristics of inspection targets. The probe card has probe needles for sending the RF inspection signal sent through the POGO pins to the inspection targets. The tips of the probe needles are brought into contact with the inspection targets, e.g., a plurality of input pads arranged on an IC chip to transmit the RF inspection signal from the test section to the IC chip and to send an RF output signal from an output pad arranged on the IC chip to the test section. The test section measures the electrical characteristics of each IC chip on the basis of the RF output signal.

A conventional probe device will be described in detail below. FIG. 8 is a schematic view showing the arrangement of a general probe device. A semiconductor wafer W as an inspection target is placed on a table 2. The table 2 can be moved in the X, Y, and Z directions by an X-Y-Z stage 4 and is rotatable in the θ direction about the Z axis as a central axis. A test head 10 that is a heavy member is attached to freely pivot up and down at a portion above the table 2 through a pair of hinges 8 arranged at the upper portion of a casing 6 of the device main body. The test head 10 is connected to a test portion (not shown) through an electrical connection means 12 which is a bundle of several hundred or thousand wires.

A POGO pin ring 18 which consists of, e.g., glass epoxy-based resin and has a performance board 14 formed of a printed-circuit board, and a large number of POGO pins 16 is arranged at the central portion of the lower surface of the test head 10. An inspection hole is formed at the center of a head plate 20 of the casing 6, and a probe card 24 is attached to the inspection hole. A large number of probe needles 22 are planted in the lower surface of the probe card 24 in correspondence with the layout of the pads of IC chips on the semiconductor wafer. When the test head 10 is pivoted to the main body side, the lower ends of the POGO pins 16 come into contact with pads (not shown) arranged on the upper surface of the probe card 24 and electrically connected with the probe needles 22 to attain electrical conduction between the lower ends of the respective POGO pins 16 and the respective probe needles 22. Since the probe needles 22 of the probe card 24 are so arranged as to contact the respective pads of the IC chips on the semiconductor wafer, an RF inspection signal from the test section is sent to the input pads of the IC chips via the route of the electrical connection means 12, the lower end of each POGO pin 16, and each probe needle 22. RF output signals from the output pads of the IC chips are sent to the test portion through a route reverse to the above route. The test section measures the electrical characteristics of the IC chips on the basis of the RF output signals. The probe needles 22 and the POGO pins 16 are generally arranged in a one-to-one correspondence, and their numbers are the same.

IC chip inspection methods include a characteristic test of executing inspection for all the chips of a semiconductor wafer, and an inspection method of performing inspection using only some pads of one chip, such as a TEG (Test of Element Group) test of inspecting only specific chips, and a burn-in test of checking by applying, e.g., temperature stress whether a potential defect exists.

On the other hand, there are an inspection method of performing inspection upon bringing at once the probe needles into contact with the pads of two or more IC chips on a single semiconductor wafer, and an inspection method of performing inspection upon bringing the probe needles into contact with the pads of all IC chips on a single semiconductor wafer if the inspection must be performed quickly. To perform such inspection, several hundred or thousand POGO pins must be brought into contact with the same number of probe needles at once, and further a large number of signals corresponding to the large number of contacts must be processed. To process such large number of signals, the use of an electrical switching means using a bus buffer and a decoder in the electrical connection path between the POGO pins and the test portion is proposed (Jpn. Pat. Appln. KOKAI Publication No. 6-268035). In this proposed invention, enormous numbers of wire lines and relays are used to process the signals, the test head 10 becomes heavy, and an increase in cost is inevitable.

In addition, arrangement of a mechanical switching means on the wire path between the pads of an inspection target and the test portion is proposed (Jpn. Pat. Appln. KOKOKU Publication No. 7-85196). The mechanical switching means of the proposed invention moves the probe needles, which directly contact the pads of the inspection target. To accurately move the probe needles in contact with the pads of the inspection target, a highly precise structure for attaching the probe needles to the probe card, and a highly precise control mechanism for moving the probe needles are required because the areas of the pads of the inspection target and the interval between the pads are very small.

Recently, the number of IC chips of a single semiconductor wafer is increasing due to an increase in semiconductor wafer size. To cope with this trend, a larger number of probe needles must be brought into contact with a larger number of pads of the inspection target in inspection. Therefore, the necessity for solving the above problems is increasing.

The present invention has been made to effectively solve the above problems.

It is an object of the present invention to provide a simple, light-weight inspection device using no test head which is a heavy member and is necessary for the conventional device.

It is another object of the present invention to simplify the structure of the inspection device by simplifying and facilitating the design and manufacture of a structure for attaching probe needles to a probe card and a control mechanism for moving the probe needles with the use of a combination of the probe card used in the conventional device and a mechanical path switching means.

It is still another object of the present invention to avoid degradations in resistance and impedance on a signal path by shortening the signal path, and perform highly precise measurement.

It is still another object of the present invention to perform an efficient inspection by arranging a plurality of mechanical path switching means and circumferentially moving them.

BRIEF SUMMARY OF THE INVENTION

An embodiment of the present invention comprises a device main body, one or more inspection targets having a plurality of connection pads, a test section for measuring electrical characteristics of the inspection targets on the basis of electrical signals from the inspection targets, mounting means for mounting the inspection targets at predetermined positions with respect to the device main body, a probe card having a plurality of probe pads on an upper surface, electrical connection means for electrically connecting connection pads of the inspection targets mounted on the mounting means and probe pads on the upper surface of the probe card, respectively, a contact block having contact pins which removably contact the probe pads of the probe card, connection means for electrically connecting the contact pins of the contact block and the test section, and contact block support/moving means for movably supporting the contact block at a periphery of the probe card.

Another embodiment of the present invention comprises a device main body, one or more inspection targets having a plurality of connection pads, a test section for measuring electrical characteristics of the inspection targets on the basis of electrical signals from the inspection targets, mounting means for mounting the inspection targets at predetermined positions with respect to the device main body, a probe card on which a plurality of probe pads are divided into a plurality of groups and the respective groups are circumferentially arranged at a peripheral portion of an upper surface, electrical connection means for electrically connecting connection pads of the inspection targets mounted on the mounting means and probe pads on the upper surface of the probe card, respectively, a contact block having contact pins which removably contact the probe pads of the probe card, connection means for electrically connecting the contact pins of the contact block and the test section, and contact block support/moving means for supporting the contact block at a periphery of the probe card to be movable in the circumferential direction.

Additional objects advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

An embodiment of an inspection device of the present invention for a semiconductor wafer as an inspection target will be described with reference to FIGS. 1 to 6.

Figure 1:
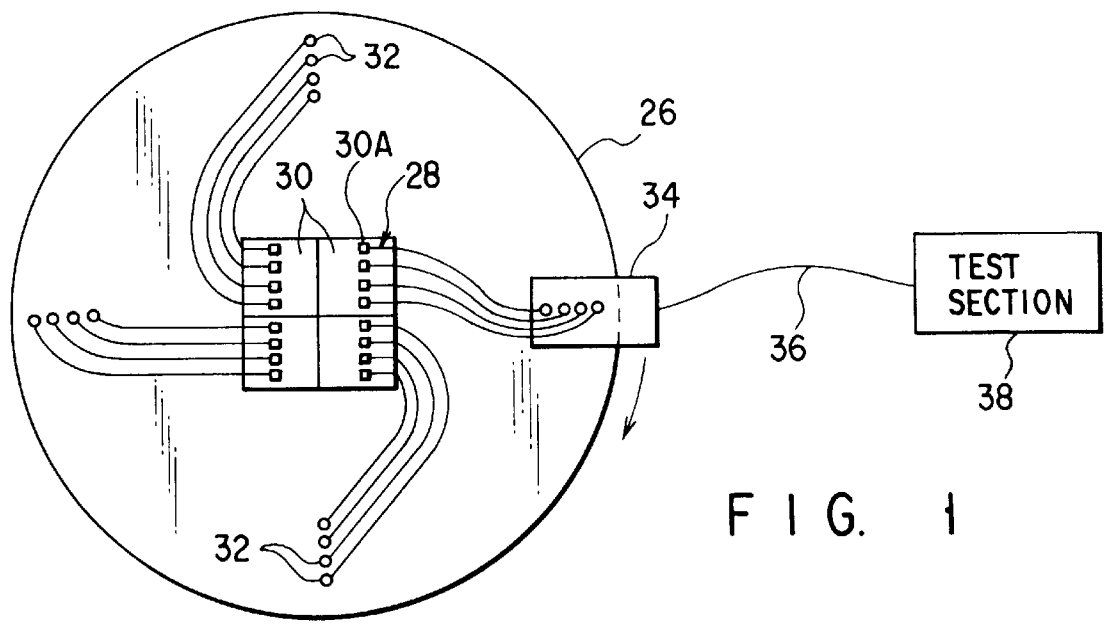
FIG. 1 is a diagram showing an inspection device according to the present invention.
Figure 2:
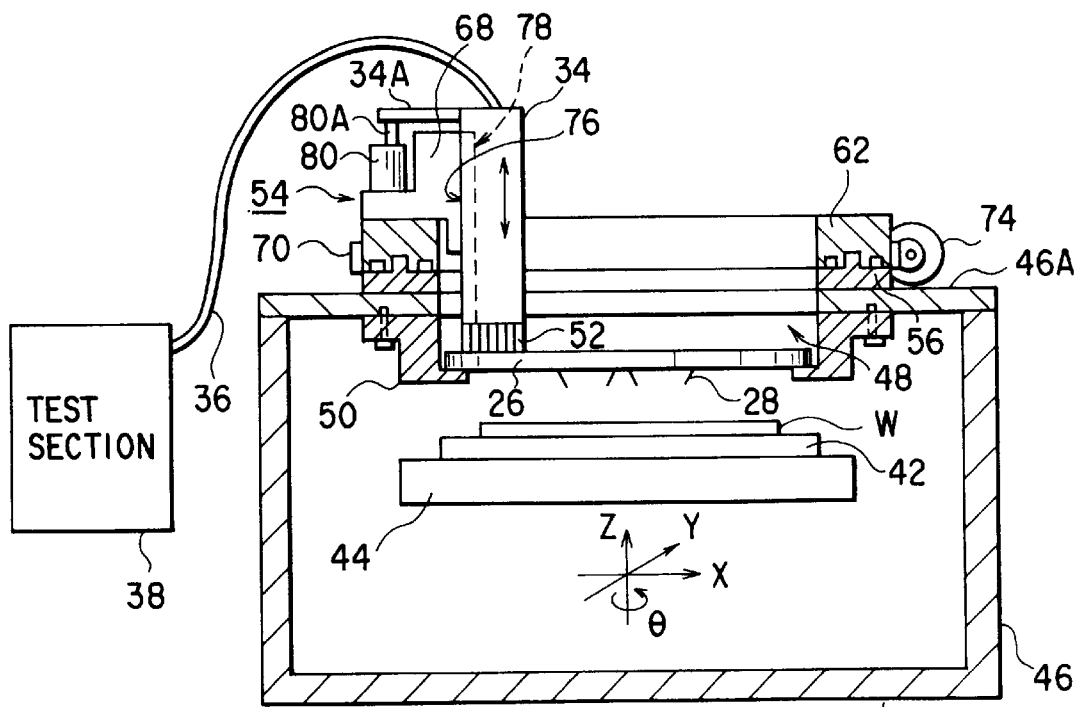
FIG. 2 is a sectional view showing the inspection device according to the present invention.

The principle of the present invention will be described with reference to FIG. 1. In FIG. 1, reference numeral 26 denotes a probe card, which has an opening portion at its central portion. A large number of probe needles 28 are arranged at the opening portion. The large number of probe needles 28 are arranged such that their distal ends contact at once desired connection pads 30A on IC chips 30 formed on the surface of a semiconductor wafer as an inspection target. In FIG. 1, the probe needles 28 contact at once the connection pads 30A of the four chips 30.

A plurality of groups of probe pads 32 are separately arranged at peripheral portions of the probe card 26. The respective probe needles 28 and the respective probe pads 32 are electrically connected through, e.g., interconnects printed on the probe card 26.

A contact block 34 is arranged at a peripheral portion of the probe card 26 to be movable along the probe pads 32 arranged at the peripheral portions. The contact block 34 has contact pins (see FIG. 2) arranged so as to contact one group of probe pads 32 at once. The respective contact pins are connected to wires, and a bundle 36 of these wires is connected to a test section 38 for inspecting the characteristics of the inspection target.

With this arrangement, one IC chip is inspected while the contact block 34 is in a state shown in FIG. 1, i.e., contact pins 52 are in contact with the probe pads 32. Upon completion of inspection of the IC chip, the contact block 34 is rotated through 90° along the peripheral portion of the probe card 26. At this position, the contact pins 52 are brought into contact with the probe pads 32 to inspect the chip. Subsequently, the contact block 34 is rotated through another 90° while all the probe needles of the probe card 26 are in contact with the pads of the four IC chips, thereby inspecting the four chips.

Next, the inspection device according to the embodiment of the present invention will be described with reference to FIGS. 2 to 5. An inspection device 40 shown in FIG. 2 comprises a mounting means which mounts a semiconductor wafer W as an inspection target at a predetermined position, and the mounting means comprises a table 42 and an X-Y-Z stage 44. The table 42 can be moved by the X-Y-Z stage 44 in the X direction, the Y direction perpendicular thereto, and the Z direction (vertical direction in FIG. 2) perpendicular to a plane including the X and Y direction. At the same time, the table 42 is rotatable in the θ direction about the Z axis.

An inspection hole 48 having a diameter slightly larger than that of the semiconductor wafer W is formed in a head plate 46A of an outer casing 46 of the device main body. The disk-like probe card 26 consisting of, e.g., a glass epoxy resin or aluminum is detachably arranged in the inspection hole 48 through a support 50.

Figure 4:
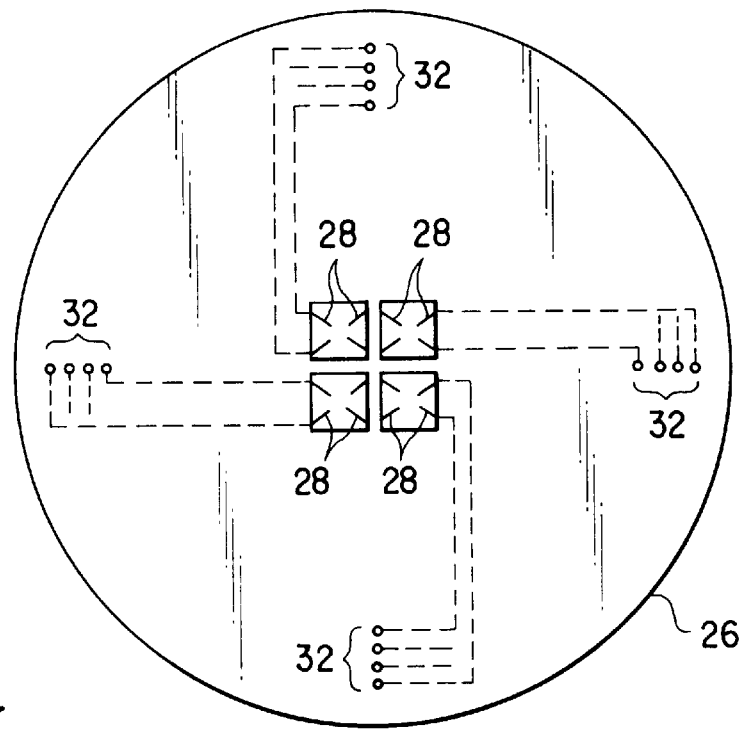
FIG. 4 is a plan view showing a probe card.

As shown in FIG. 4, e.g., four opening portions are formed at the central portion of the probe card 26. The plurality of probe needles 28 inclined downward are arranged around the lower surfaces of the opening portions of the probe card. The distal ends of the probe needles 28 are so positioned as to contact at once the connection pads of the respective IC chips formed on the surface of the semiconductor wafer W, as described above. In the example shown in FIG. 4, 16 probe needles 28 are arranged for illustrative convenience. Actually, several hundred or thousand probe needles 28 are arranged to simultaneously contact the pads of, e.g., 32 memory chips at once.

The plurality of groups of probe pads 32 are separately arranged at peripheral portions on the upper side of the probe card 26. Each probe pad 32 and a corresponding probe needle 28 are electrically connected through a printed interconnect or the like formed on the probe card 26. In the illustrated example, 16 probe pads 32 are divided into four groups. While the distance between the adjacent probe needles 28 is 40 $\mu$m to 100 $\mu$m, and the distance between adjacent connection pads 30A on the semiconductor wafer W is similarly short, the distance between the adjacent probe pads 32 is greatly longer than these distances, e.g., 1.25 mm to 2.45 mm. For this reason, when the contact pins 52 are brought into contact with the probe pads, like the present invention, the structure having the contact pins arranged on the contact block is easy to manufacture, and its maintenance and control of moving the contact block are easy, compared to the case wherein the contact pins 52 are brought in direct contact with the connection pad 30A, like in the conventional proposal (see Jpn. Pat. Appln. KOKOKU Publication No. 7-85196).

Referring back to FIG. 2, the contact block 34 has e.g., four contact pins 52 at its lower portion. The distal ends of all the four contact pins simultaneously come into contact with one group of probe pads 32 to be electrically conductive with the respective probe pads 32. Each contact pin 52 incorporates an elastic member such as a spring, and its distal end can be extended outside with a slight stroke. The contact block 34 is moved along the peripheral portion of the probe card by a contact block support/moving means 54.

The contact block support/moving means 54 comprises a guide ring 56 arranged on the head plate 46A of the casing, a circumferential direction moving ring member 62, a ring drive motor 74, a block table 68, and a block elevating mechanism 80.

Figure 3:
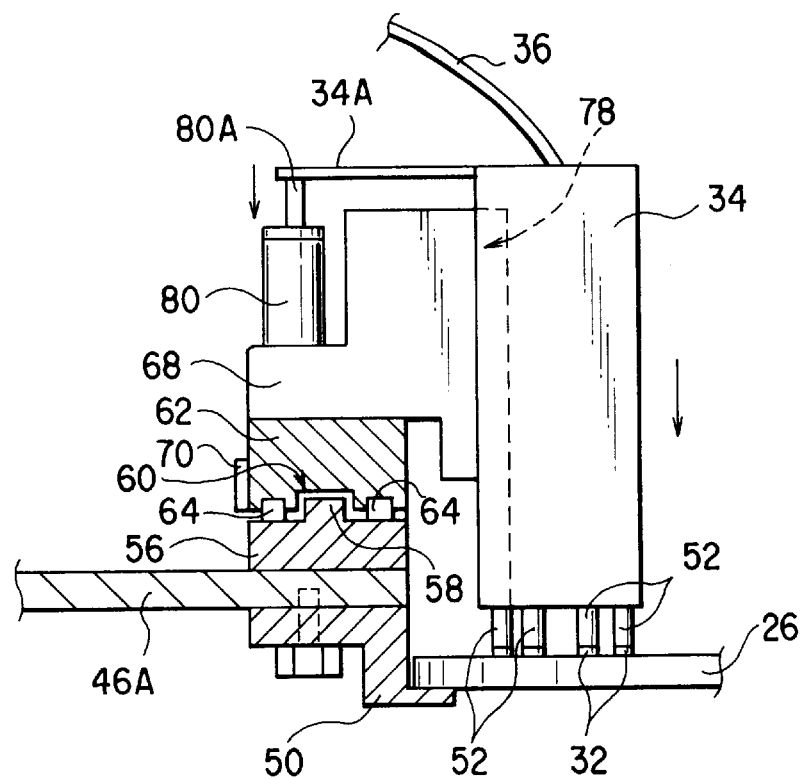
FIG. 3 is an enlarged view showing a portion around the contact block of the inspection device shown in FIG. 2.

Referring to FIG. 3, the guide ring 56 is set at the peripheral edge portion of the inspection hole 48 formed at the central portion of the head plate 46A. A ring-like projecting guide rail 58 is arranged on the upper surface of the guide ring 56. A guide groove 60 is formed in the lower surface of the circumferential direction moving ring member 62. The circumferential direction moving ring member 62 is rotatably mounted on the guide ring 56 such that the guide rail 58 fits in the guide groove 60.

Figure 5:
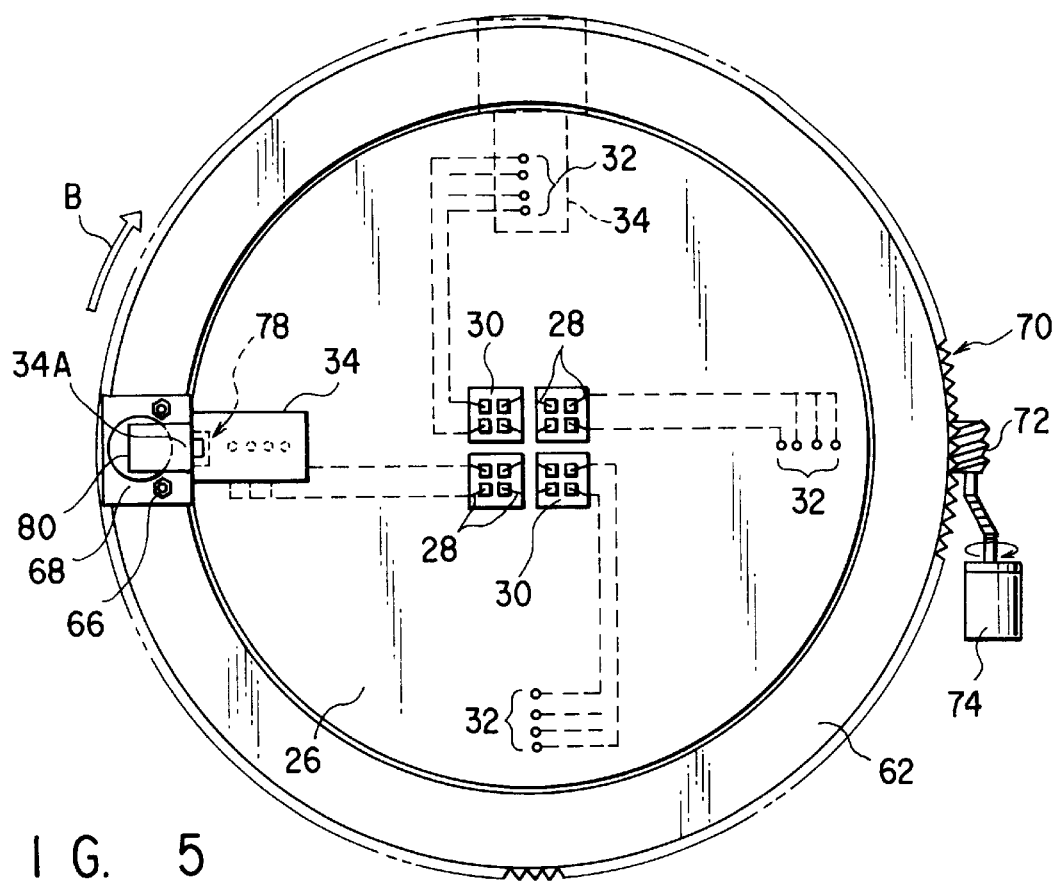
FIG. 5 is a plan view showing main part of the inspection device when an inspection target is inspected.

In FIG. 5, a rack 70 is formed on the side surface of the circumferential direction moving ring member 62. A worm 72 of the drive motor 74 meshes with the rack 70. Upon driving the drive motor 74, the circumferential direction moving ring member 62 rotates on the guide ring 56 through the worm 72 to move to a predetermined position. To keep the positional precision, the guide ring 56 and the circumferential direction moving ring member 62 are preferably formed of a hard material, e.g., stainless steel.

The contact block 34 is fixed to the circumferential direction moving ring member 62 with screws 66 through the block table (made of, e.g., aluminum) 68, and rotates and moves together with the circumferential direction moving ring member 62. The contact block 34 is attached to the block table 68 by fitting, in a slide groove 78, a slide rail 76 which is arranged on the block table 68 and extends vertically. The contact block 34 can slide vertically in cooperation of the slide groove 78 and the slide rail 76. The block table 68 has the block elevating mechanism (actuator) 80 extendable in the vertical direction in FIG. 5. An arm 34A of the contact block 34 is coupled to an extension rod 80A of the actuator 80. The contact block 34 can be elevated upon vertical movement of the extension rod 80A of the block elevating mechanism 80.

The wires (not shown) connected to the respective contact pins 52 of the contact block 34 are bundled to be the wire bundle 36, which is connected to the test section 38. The test section 38 sends an RF inspection signal of about several 10 to several hundred MHz to the inspection target through the route of the wire bundle 36, the contact pin 52, the probe pad 32, internal interconnects of the probe card, the connection pad, and the probe needle 28, and receives a return signal from the inspection target through the reverse route. For this reason, it is important that the impedance of the route be as low as possible, hardly vary for each individual inspection target, and be matched with the inspection target. It is necessary for the wire bundle 36 to be set as short as possible, and the internal interconnects of the probe card to be similarly short.

The operation of the inspection device having the above arrangement will be described. The semiconductor wafer W is placed on the table 42 and aligned with the probe pads in the X and Y directions. The table 42 is moved upward in the Z direction to bring a predetermined connection pad 30A into contact with the distal end of a corresponding probe needle 28. In this state, all the probe needles 28 simultaneously come into contact with the respective connection pads 30A of the four chips in FIG. 5.

The contact block 34 positioned above the probe card 26 is moved downward. The four contact pins 52 held by the contact block elastically come into contact with one of the four groups of probe pads 32 on the upper surface of the probe card 26 to render them electrically conductive. In the example shown in FIG. 5, the contact block 34 is positioned on the left end of the probe card 26, and the contact pins 52 contact one group of four probe pads 32. In this state, an RF inspection signal is sent from the test section 38 to an IC chip on the semiconductor wafer W through the above route to inspect the characteristics of one IC chip.

Upon completion of inspection of the characteristics of this chip, the contact block support/moving means constituted by the block table 68, the block elevating mechanism 80, the guide ring 56, the circumferential direction moving ring member, and the drive motor 74 is driven to bring the contact pins into contact with the next group of probe pads 32, thereby executing inspection of the characteristics of the next IC chip.

Figure 6:
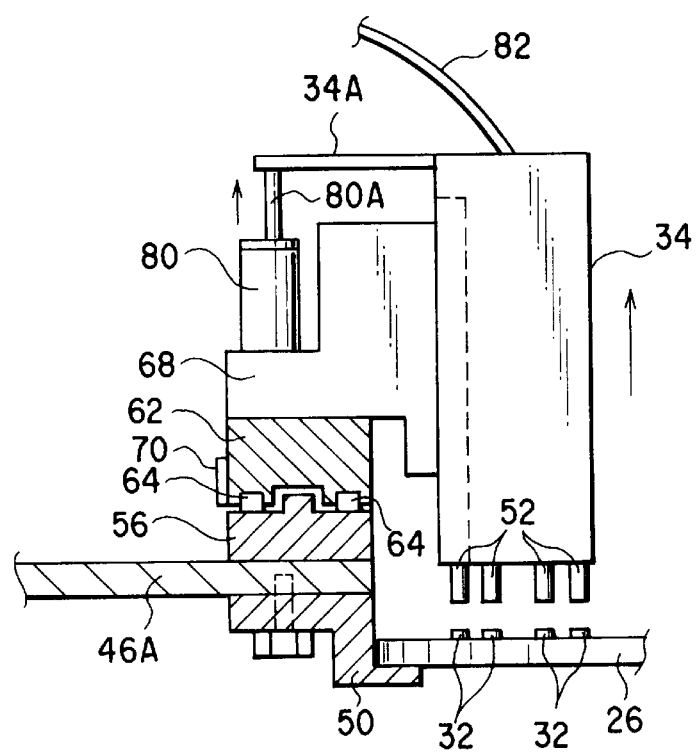
FIG. 6 is a view showing a state wherein the contact block is moved upward.

The inspection process will be described in more detail. As shown in FIG. 6, the block elevating mechanism (actuator) 80 arranged on the block table 68 is driven to extend the extension rod 80A upward and move the contact block 34 having the contact pins 52 upward by a slight distance, thereby separating the contact pins 52 from the probe pads 32.

The ring drive motor 74 of the contact block moving means 54 is driven to rotate the worm 72 meshing with the rack 70, thereby rotating the circumferential direction moving ring member 62 through 90° in the direction of an arrow B (or opposite direction) in FIG. 5. The contact block 34 is positioned at the upper end of the probe card 26 as a next inspection position, as indicated by an alternate long and short dashed line in FIG. 5. Next, the block elevating mechanism 80 is driven again to move the contact block 34 downward and bring the contact pins 52 into contact with a new group of probe pads 32, thereby rendering the contact pins 52 and the probe pads 32 electrically conductive. In this state, an inspection signal is supplied from the test portion 38 in the same manner described above, thereby inspecting the characteristics of a chip corresponding to the group of probe pads 32.

Every time inspection of the characteristics of one IC chip is completed, the contact block 34 is rotated through 90° to inspect the characteristics of a new chip. Finally, all the IC chips are inspected. Needless to say, the X-Y-Z stage 44 is fixed until inspection of the four chips is complete, and the probe needles 28 remain in contact with all the connection pads 30A of the IC chips of the inspection target. Upon completion of inspection of the characteristics of the four chips, the X-Y-Z stage 44 is driven to move to a position where the pads of four new IC chips contact the probe needles of the probe card, and the characteristics of the IC chips are inspected in the same manner described above. In this case, to prevent torsion of the wire bundle 36, the contact block 34 is alternately moved in the direction of the arrow B and the opposite direction.

Figure 7:
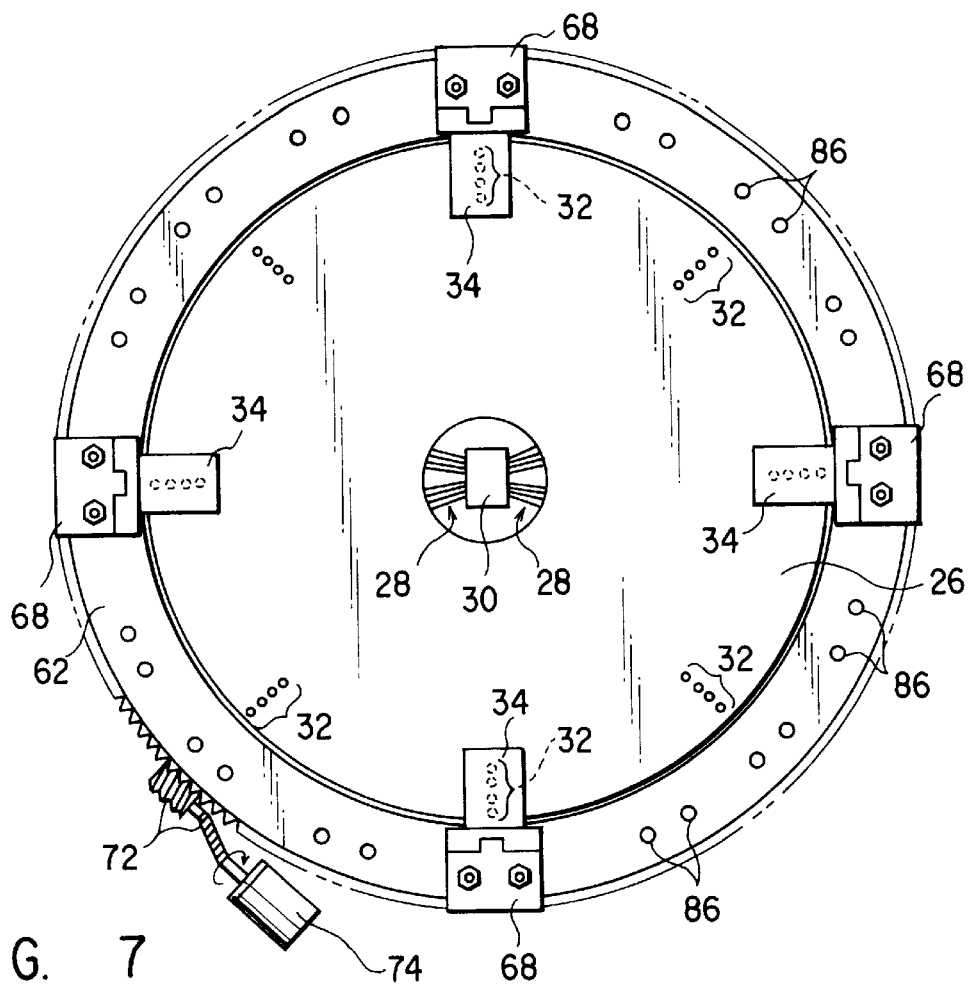
FIG. 7 is a schematic view showing the arrangement according to another embodiment of the present invention.

FIG. 7 shows another embodiment of the present invention. Four contact blocks 34 are arranged on a circumferential direction moving ring member 62 at equal intervals. A large number of probe needles 28 are planted in an opening portion formed at the central portion of a probe card 26. The probe needles 28 contact at once a large number of connection pads arranged on one IC chip 30. Eight groups of probe pads are separately arranged at peripheral portions of the probe card 26.

The circumferential direction moving ring member 62 has a large number of bolt holes 86. An arbitrary number of contact blocks can be detachably attached with screws by using the bolt holes 86 at proper positions. When the four contact blocks 34 are attached to the circumferential direction moving ring member 62, as shown in FIG. 7, the characteristics of an inspection target can be inspected only by rotating the circumferential direction moving ring member 62 through 45°.

In the present invention, by substantially uniformly arranging probe pads 32 on the probe card at the periphery of the probe card, the lengths of the respective internal wires connecting connection pads 30A and probe pads 32 can be almost equally minimized for all chips, and the impedances can be equally set low. Therefore, the inspection precision at the test section can be increased.

In the present invention, the contact pins 52 contact the probe pads having a larger interval therebetween and a larger area than those of the connection pads 30A. Compared to the case wherein the contact pins 52 contact the connection pads 30A, the design and manufacture of the structure for attaching the probe needles to the probe card and the control mechanism for moving the probe needles can be simplified and facilitated, and the structure of the inspection device can be simplified.

In the present invention, while all the probe needles 28 are in contact with the connection pads 30A of a plurality of IC chips, the contact block 34 is sequentially moved to sequentially bring the contact pins 52 into contact with the groups of probe pads 32, thereby inspecting the plurality of IC chips. The number of contacts with the connection pad 30A which require a high positional precision can be decreased.

Figure 8:
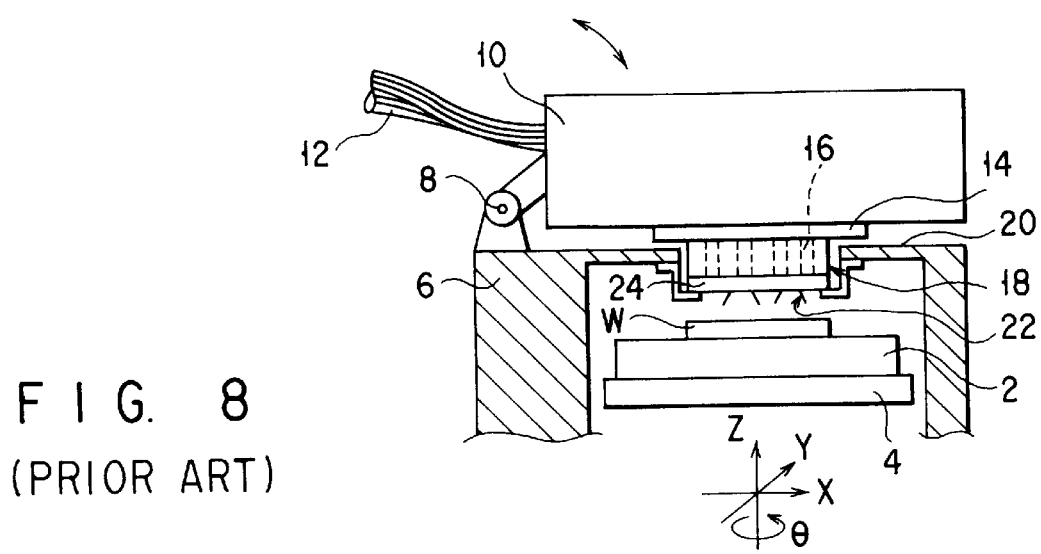
FIG. 8 is a schematic view showing the arrangement of a conventional inspection device.

The conventional device comprises the test head (see FIG. 8). The test head incorporates complicated wires and is considerably heavy (e.g., 50 kg to 100 kg). Support and rotation of this test head require a strong, complicated mechanism. The present invention employs the contact block support/moving mechanisms mounted on the head plate, and the mechanical path switching mechanism constituted by the contact block having the contact pins. With this arrangement, no test head is used, and a simple-structure, low-cost inspection device can be realized.

In the above embodiments, one contact block 34 has the four contact pins 52, which contact the four probe pads 32 at once. This structure is only an example used to practice the present invention. For example, the number of contact pins 52 held by one contact block 34 may be smaller or larger.

The above embodiments have exemplified the case wherein all the probe needles are brought into contact with four IC chips at once. The number of IC chips which all the probe needles contact may be smaller or larger.

Although the inspection target is positioned at the central portion of the probe card 26, it may be arbitrarily positioned within the probe card.

Although one contact block 34 is arranged in the above embodiment, a plurality of contact blocks 34 may be arranged. For example, when two contact blocks are arranged, they can be positioned to be symmetrical about the center of the guide ring 56. When four contact blocks are arranged, they can be arranged at positions each shifted by 90° with respect to the center of the guide ring 56.

The above embodiments have exemplified the case wherein inspection is performed by bringing the contact block into contact with one IC chip once. A plurality of IC chips can be inspected by bringing the contact block into contact with one IC chip a plurality of number of times, or by bringing the contact block into contact with a plurality of IC chip once.

In the above embodiments, a semiconductor wafer is inspected. However, the inspection device of the present invention is not limited to inspection of the semiconductor wafer, and can also be applied to inspection of electronic components suitable for inspection of this device, e.g., an LCD board.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. An inspection device for inspecting one or more inspection targets having a plurality of connection pads comprising:

a device main body;

a test section for measuring electrical characteristics of said inspection target on the basis of electrical signals from said inspection target;

mounting means for mounting said inspection target at predetermined positions with respect to said device main body;

a probe card having a plurality of probe pads on an upper surface;

electrical connection means for electrically connecting said plurality of connection pads and said plurality of probe pads;

a contact block having a plurality of contact pins that contact said plurality of probe pads;

an elevating mechanism for detaching said plurality of contact pins from said plurality of probe pads of said probe card;

connection means for electrically connecting said plurality of contact pins of said contact block and said test section; and contact block support/moving means for movably supporting said contact block at a periphery of said probe card.

2. The device according to claim 1, wherein said electrical connection means comprises a plurality of probe needles arranged on said probe card.

3. The device according to claim 1, wherein said contact block support/moving means comprises a guide rail arranged on said main body, and contact block holding means, movably mounted on said guide rail, for holding said contact block.

4. The device according to claim 3, wherein said contact block includes a plurality of contact blocks.

5. The device according to claim 3, wherein said contact block holding means comprises an elevating mechanism for elevating said contact block to removably bring said contact pins of said contact block into said plurality of probe pads of said probe card, respectively.

6. The device according to claim 3, wherein said contact block holding means comprises a mechanism which detachably holds said contact block.

7. An inspection device for inspecting one or more inspection targets having a plurality of connection pads comprising:

a device main body;

a test section for measuring electrical characteristics of said inspection target on the basis of electrical signals from said inspection target;

mounting means for mounting said inspection target at predetermined positions with respect to said device main body;

a probe card on which a plurality of probe pads are divided into a plurality of groups and the respective groups are circumferentially arranged at a peripheral portion of an upper surface;

electrical connection means for electrically connecting said plurality of connection pads and said plurality of probe pads;

a contact block having a plurality of contact pins that contact said plurality of probe pads;

an elevating mechanism for detaching the plurality of contact pins from said plurality of probe pads of said probe card;

connection means for electrically connecting said plurality of contact pins of said contact block and said test section; and contact block support/moving means for supporting said contact block at a periphery of said probe card to be movable in the circumferential direction.

8. The device according to claim 7, wherein said electrical connection means comprises a plurality of probe needles arranged on said probe card.

9. The device according to claim 7, wherein said contact block support/moving means comprises a guide rail arranged on said main body, and contact block holding means, movably mounted on said guide rail, for holding said contact block.

10. The device according to claim 9, wherein said contact block includes a plurality of contact blocks.

11. The device according to claim 9, wherein said contact block holding means comprises an elevating mechanism for elevating said contact block to removably bring said contact pins of said contact block into said probe pads of said probe card, respectively.

12. The device according to claim 9, wherein said contact block holding means comprises a mechanism which detachably holds said contact block.

* * * * *